(12) United States Patent
Shvets et al.

(10) Patent No.: US 10,591,650 B2
(45) Date of Patent: Mar. 17, 2020

(54) THIN-FILM INTEGRATED SPECTRALLY-SELECTIVE PLASMONIC ABSORBER/EMITTER FOR SOLAR THERMOPHOTOVOLTAIC APPLICATIONS

(71) Applicant: IP Equity Management, LLC, Nashville, TN (US)

(72) Inventors: Gennady Shvets, Austin, TX (US); Chih-Hui Wu, Austin, TX (US)

(73) Assignee: IP EQUITY MANAGEMENT, LLC, Austin, TX (US)

( * ) Notice: Subject to any disclaimer, the term of this patent is extended or adjusted under 35 U.S.C. 154(b) by 0 days.

(21) Appl. No.: 16/249,295

(22) Filed: Jan. 16, 2019

(65) Prior Publication Data
US 2019/0265394 A1 Aug. 29, 2019

Related U.S. Application Data

(62) Division of application No. 13/306,975, filed on Nov. 29, 2011, now Pat. No. 10,197,711.

(60) Provisional application No. 61/487,493, filed on May 18, 2011.

(51) Int. Cl.
*G02B 5/00* (2006.01)
*H02S 10/30* (2014.01)
*F24S 70/20* (2018.01)
*F24S 60/00* (2018.01)

(52) U.S. Cl.
CPC .............. *G02B 5/008* (2013.01); *F24S 60/00* (2018.05); *F24S 70/20* (2018.05); *H02S 10/30* (2014.12); *Y02E 10/40* (2013.01)

(58) Field of Classification Search
CPC ... G02B 5/008; F24J 2/34; F24J 2/485; Y02E 10/40; H02S 10/30
See application file for complete search history.

(56) References Cited

U.S. PATENT DOCUMENTS

| | | | | | |
|---|---|---|---|---|---|
| 3,433,676 A | * | 3/1969 | Stein Franks | ........... | H02S 10/30 136/253 |
| 4,234,352 A | * | 11/1980 | Swanson | ................. | F24S 20/20 136/253 |
| 4,321,300 A | * | 3/1982 | Farrauto | ................. | F24S 70/25 428/332 |

(Continued)

*Primary Examiner* — Golam Mowla

(57) ABSTRACT

A solar thermophotovoltaic system includes a heat exchange pipe containing a heat exchange fluid, and a thin-film integrated spectrally-selective plasmonic absorber emitter (ISSAE) in direct contact with an outer surface of the heat exchange pipe, the ISSAE including an ultra-thin non-shiny metal layer comprising a metal strongly absorbing in a solar spectral range and strongly reflective in an infrared spectral range, the metal layer having an inner surface in direct contact with an outer surface of the heat exchange pipe. The system further includes a photovoltaic cell support structure having an inner surface in a concentric configuration surrounding at least a portion of the ISSAE; and an airgap separating the support structure and the outer surface of the metal layer. The support structure includes a plurality of photovoltaic cells arranged on a portion of the inner surface of the support structure and configured to receive emissions from the ISSAE, and a solar energy collector/concentrator configured to allow solar radiation to impinge a portion of the metal layer.

10 Claims, 6 Drawing Sheets

(56) References Cited

U.S. PATENT DOCUMENTS

| | | | | |
|---|---|---|---|---|
| 4,419,532 A * | 12/1983 | Severns | F24S 60/00 | 136/253 |
| 4,584,426 A * | 4/1986 | Nelson | H02S 10/30 | 136/253 |
| 4,746,370 A * | 5/1988 | Woolf | H02S 10/30 | 136/246 |
| 4,750,943 A * | 6/1988 | Nelson | F24S 20/20 | 136/253 |
| 4,776,895 A * | 10/1988 | Goldstein | H02S 99/00 | 136/249 |
| 4,836,862 A * | 6/1989 | Pelka | H02S 99/00 | 136/253 |
| 5,057,162 A * | 10/1991 | Nelson | F21H 1/02 | 136/253 |
| 5,066,339 A * | 11/1991 | Dehlsen | H02S 99/00 | 136/253 |
| 5,080,724 A * | 1/1992 | Chubb | H02S 10/30 | 136/253 |
| 5,439,532 A * | 8/1995 | Fraas | H02S 10/30 | 136/253 |
| 5,593,509 A * | 1/1997 | Zuppero | H02S 10/30 | 136/253 |
| 5,611,870 A * | 3/1997 | Horne | G02B 5/204 | 136/253 |
| 5,616,186 A * | 4/1997 | Fraas | H02S 10/30 | 136/253 |
| 5,932,029 A * | 8/1999 | Stone | H02S 10/30 | 136/253 |
| 5,932,885 A * | 8/1999 | DeBellis | F23C 3/002 | 136/253 |
| 6,065,418 A * | 5/2000 | Goldstein | H02S 10/30 | 114/312 |
| 6,091,018 A * | 7/2000 | Fraas | H02S 10/30 | 136/253 |
| 6,198,038 B1 * | 3/2001 | Shukla | F23C 3/002 | 136/205 |
| 6,473,220 B1 * | 10/2002 | Clikeman | G02B 5/20 | 359/245 |
| 6,583,350 B1 * | 6/2003 | Gee | H01K 1/04 | 136/253 |
| 6,720,704 B1 * | 4/2004 | Tavkhelidze | F25B 21/00 | 136/200 |
| 7,368,870 B2 * | 5/2008 | Wang | H01K 1/06 | 313/341 |
| 7,619,159 B1 * | 11/2009 | Ortabasi | H01L 31/0549 | 136/246 |
| 7,825,366 B2 * | 11/2010 | Barker | B82Y 20/00 | 136/243 |
| 8,841,548 B2 * | 9/2014 | Giebink | H01L 31/055 | 136/259 |
| 9,252,701 B1 * | 2/2016 | Tarabishi | H02S 10/30 | |
| 2004/0231717 A1 * | 11/2004 | Greiff | H02S 10/30 | 136/253 |
| 2009/0056791 A1 * | 3/2009 | Pfenninger | H01L 31/055 | 136/247 |
| 2009/0095341 A1 * | 4/2009 | Pfenninger | H01L 31/048 | 136/246 |
| 2009/0188549 A1 * | 7/2009 | DiMatteo | H01L 31/125 | 136/253 |
| 2009/0217977 A1 * | 9/2009 | Florescu | H01L 31/02322 | 136/256 |
| 2009/0277488 A1 * | 11/2009 | Greiff | H01L 31/024 | 136/200 |
| 2010/0037952 A1 * | 2/2010 | Lin | H01L 31/022425 | 136/256 |
| 2010/0319749 A1 * | 12/2010 | Greiff | H02S 10/30 | 136/213 |
| 2011/0011455 A1 * | 1/2011 | Ji | B82Y 20/00 | 136/257 |
| 2011/0114176 A1 * | 5/2011 | Slager | H01L 31/0236 | 136/257 |
| 2011/0284059 A1 * | 11/2011 | Celanovic | G05F 1/67 | 136/253 |
| 2014/0137941 A1 * | 5/2014 | Orsley | A01G 9/02 | 136/259 |
| 2015/0068599 A1 * | 3/2015 | Chou | C23C 16/45525 | 136/257 |

* cited by examiner

FIG. 9A  FIG. 9B

CALCULATED ABSORBANCE SPECTRA OF THE PREFERRED EMBODIMENT
OF FIGURE 9A, FOR SEVERAL SETS OF GEOMETRIC DIMENSIONS:

A = L: 383nm, W: 206nm, D: 83nm, G: 27nm
B = L: 393nm, W: 230nm, D: 79nm, G: 24nm
C = L: 404nm, W: 252nm, D: 73nm, G: 23nm
D = L: 396nm, W: 269nm, D: 72nm, G: 22nm

THIN-FILM INTEGRATED SPECTRALLY-SELECTIVE PLASMONIC ABSORBER/EMITTER FOR SOLAR THERMOPHOTOVOLTAIC APPLICATIONS

CROSS-REFERENCE TO RELATED APPLICATIONS

This application is a continuation of U.S. Non-Provisional patent application Ser. No. 13/306,975 entitled "THIN-FILM INTEGRATED SPECTRALLY-SELECTIVE PLASMONIC ABSORBER/EMITTER FOR SOLAR THERMOPHOTOVOLTAIC APPLICATIONS" filed Nov. 29, 2011. This application also claims priority pursuant to 35 U.S.C. § 119(e) to U.S. Provisional Patent Application 61/487,493 entitled "THIN-FILM METAMATERIALS FOR SOLAR THERMAL ENERGY AND SOLAR THERMOPHOTOVOLTAICS (TPV) APPLICATIONS" filed May 18, 2011, which is hereby incorporated herein by reference in its entirety.

STATEMENT REGARDING FEDERALLY SPONSORED RESEARCH OR DEVELOPMENT

Development of this invention was in whole or in part supported by an Office of Naval Research (ONR) Grant No. N00014-10-1-0929.

BACKGROUND OF THE INVENTION

This invention pertains to the fields of solar thermal energy and solar thermophotovoltaics.

DESCRIPTION OF THE RELATED ART

Spectral control of the surface emissivity is essential in applications pertaining to concentrated solar thermal (CST) systems and solar thermophotovoltaic (TPV) systems because it enables high conversion efficiency. Ideally, said spectral control might employ thin-film structures which simultaneously function as (i) efficient broad-band absorbers of solar radiation in the spectral region 250 nm<$\lambda$<1 μm, (ii) extremely poor absorbers of any infrared radiation for $\lambda$>3.5 μm, and (iii) spectrally selective infrared emitters that can be tuned to emit in the 1.5 μm<$\lambda$<2.5 μm range, thus matching the bandgap of the particular TPVs employed.

Thin-film structures capable of accomplishing some of these requirements have been proposed, but none of them to date accomplishes all three at once.

BRIEF SUMMARY OF THE INVENTION

This invention comprises a novel thin-film integrated spectrally-selective plasmonic absorber/emitter (ISSAE) that functions as (i) an efficient broad-band absorber of solar radiation in the spectral region 250 nm<$\lambda$<1 μm, (ii) an extremely poor absorber of any infrared radiation for $\lambda$>3.5 μm (this lower bound can be engineered depending on the desired operating temperature of the hot surface), and (iii) a spectrally selective infrared emitter that can be tuned to emit in the 1.5 μm<$\lambda$<2.5 μm range.

The ISSAE described herein enables building day-and-night TPV systems capable of producing electricity with and without sunlight. During the day, the high temperature of the ISSAE is maintained by the incident sunlight. The ISSAE heats the heat-exchange fluid circulated inside long thermally-insulated pipes, as well as provides IR photons to the photovoltaic cell for electricity production. During the night, the high temperature of the ISSAE is maintained by the heat released by the heat-exchange fluid. The hot ISSAE continues supplying infrared photons to the photovoltaic cell for night-time electricity production. The efficiency of this day-and-night system is enhanced because the ultra-thin film is wrapped continuously (with no geometric breaks) around the heat-exchange pipe and performs all three functions at once: absorption, thermal insulation against radiative energy loss, and selective emission.

By Kirchhoff's Law, low infrared absorption implies low infrared emission. Therefore, when heated to high temperatures, a hot surface cloaked in the herein-described ISSAE emits much less infrared radiation than the one without such a wrapping. Moreover, the herein-described ISSAE can be designed so as to reflect all or most of the incident infrared radiation except in a narrow frequency band. Quantitatively, Kirchhoff's Law relates emissivity of the structure to its absorption through the simple formula for "grey body" emission: $E_{GB}(\lambda,T) = E_{BB}(\lambda,T) \times \overline{A}(\lambda)$ where $E_{BB}(\lambda)$ is the broad Black Body emission while $\overline{A}(\lambda)$ is the angle-averaged absorptivity of the Grey Body. It is the ability to engineer $\overline{A}(\lambda)$ that in turn enables us to engineer the "grey body" emission to meet the need of various applications. Specifically, by designing $\overline{A}(\lambda)$ to vanish for most wavelengths except in the narrow spectral range, we can accomplish three goals.

A first goal is to significantly (by orders of magnitude) reduce the spectrally-integrated emissivity. Accomplishing this is equivalent to achieving thermal isolation. A small power source can then be used to heat up the isolated sample to a higher temperature than that possible without thermal isolation. This is the consequence of the power balance between the solar power delivered to the sample and the temperature-dependent infrared emission. Moreover, the reduction of infrared losses results in a more compact system because less or no solar concentration is required.

A second goal is to efficiently absorb all or most of the solar radiation incident on the hot surface from the Sun without emitting any of the infrared radiation produced by the hot surface itself. This is possible because the Sun is much hotter than the envisioned hot surface. Therefore, solar light absorption is spectrally removed from the hot surface's infrared emission. A preferred embodiment capable of accomplishing this goal is illustrated in FIG. 1. Note that normal reflectivity is under 20% (i.e. absorption is over 80%) for the solar range 250 nm<$\lambda$<1 μm. However, the infrared reflectivity exceeds 90% (or absorption and emissivity are below 10%) in the infrared for $\lambda$>3.5 μm. These properties persist for oblique incidence. As the result, a hot surface wrapped by one or more of the herein-described ISSAE embodiments can be effectively thermally insulated. For example, a flat ISSAE surface can be heated to 280 C by direct overhead sunlight (no solar concentration assumed), whereas the black body surface subjected to the same illumination would only heat to 100 C. Of course, higher temperatures are achievable using solar concentrators that focus the sunlight onto the ISSAE.

A third goal is to target a particular emission spectrum. Hence, the radiation that is absorbed from an external source is predominantly emitted within a narrow spectral range. The emission profile is engineered by changing the parameters of the herein-described ISSAE. The emission wavelength can be matched to the bandgap of a particular type of photovoltaic cell, thereby increasing the efficiency of energy conversion into electricity. Example spectral radiance data for a hot surface cloaked in an ISSAE wrapper is shown in FIG. 2, for hot plate temperatures of 500 K, 600 K, and 700 K. The emission peak is engineered to occur at $\lambda=2.5$ μm (or $\hbar\omega=0.5$ eV). One semiconductor whose bandgap coincides with this photon energy is InGaAsSb.

BRIEF DESCRIPTION OF THE DRAWINGS

FIG. 9A illustrates a preferred embodiment of an ISSAE. The upper regions comprise squares of non-shiny refractory metal (ex: tungsten or molybdenum). The lower region comprises non-metallic spacer material (ex: aluminum nitride).

FIG. 9B illustrates conceptually a preferred embodiment of a TPV system comprising a preferred embodiment of an ISSAE, employing the ISSAE and a heat exchange fluid to extend the power-generating period beyond the daytime.

DETAILED DESCRIPTION OF THE INVENTION

This invention comprises a novel thin-film integrated spectrally-selective plasmonic absorber/emitter (ISSAE) capable of efficiently absorbing sunlight with close to blackbody efficiency, but which emits with strongly-reduced efficiency in mid-infrared. Design of said ISSAE is based on an array of metal plates of engineered shape (squares, rectangles, hexagons, swiss-crosses, for example) separated from a metal ground plate by a thin dielectric. Materials for ISSAE fabrication include those which are strongly reflective in the infrared yet strongly absorptive in the UV-visible (for example Tungsten, Platinum and Molybdenum). The specific geometry of said array of metal plates, said dielectric, and said ground plate are each determined based upon the desired emissivity wavelength, being calculated using tools known to those familiar with the art, for example, the finite element method software COMSOL Multiphysics.

Application of said ISSAEs includes wrapping hot surfaces, providing thermal insulation through suppression of infrared emission. Application of said ISSAEs also includes engineering their thermal emission spectrum to coincide with the bandgap of thermo-photovoltaic cells.

Figure 1:
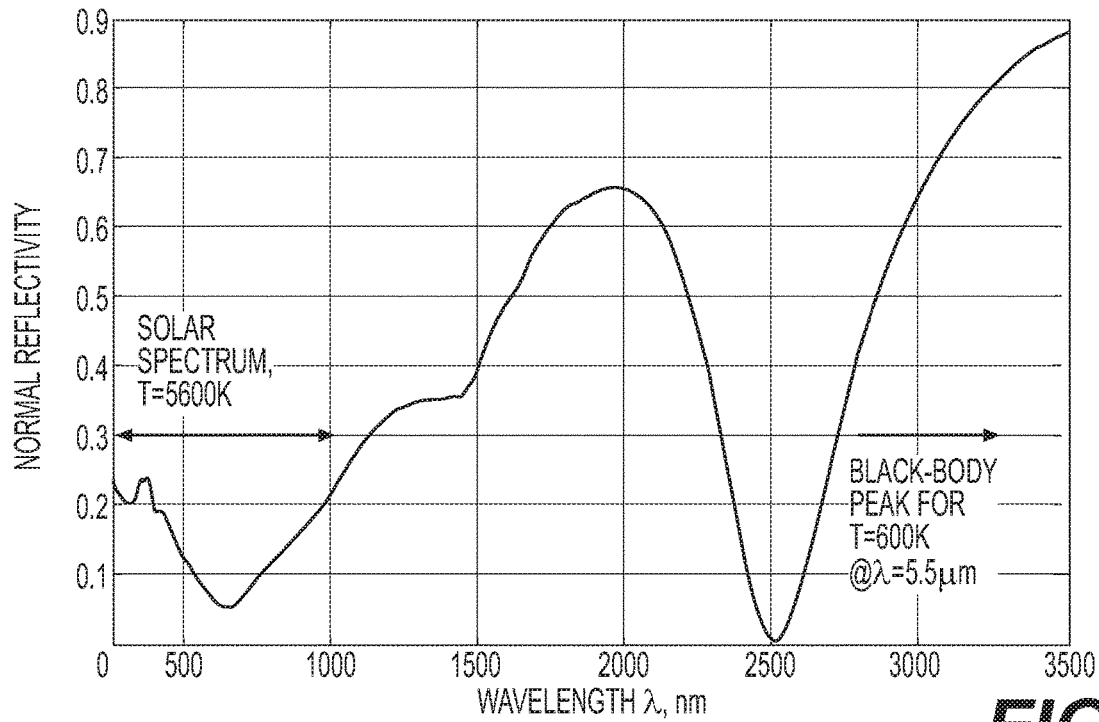
FIG. 1 illustrates the reflectivity of a preferred embodiment of an ISSAE.
Figure 2:
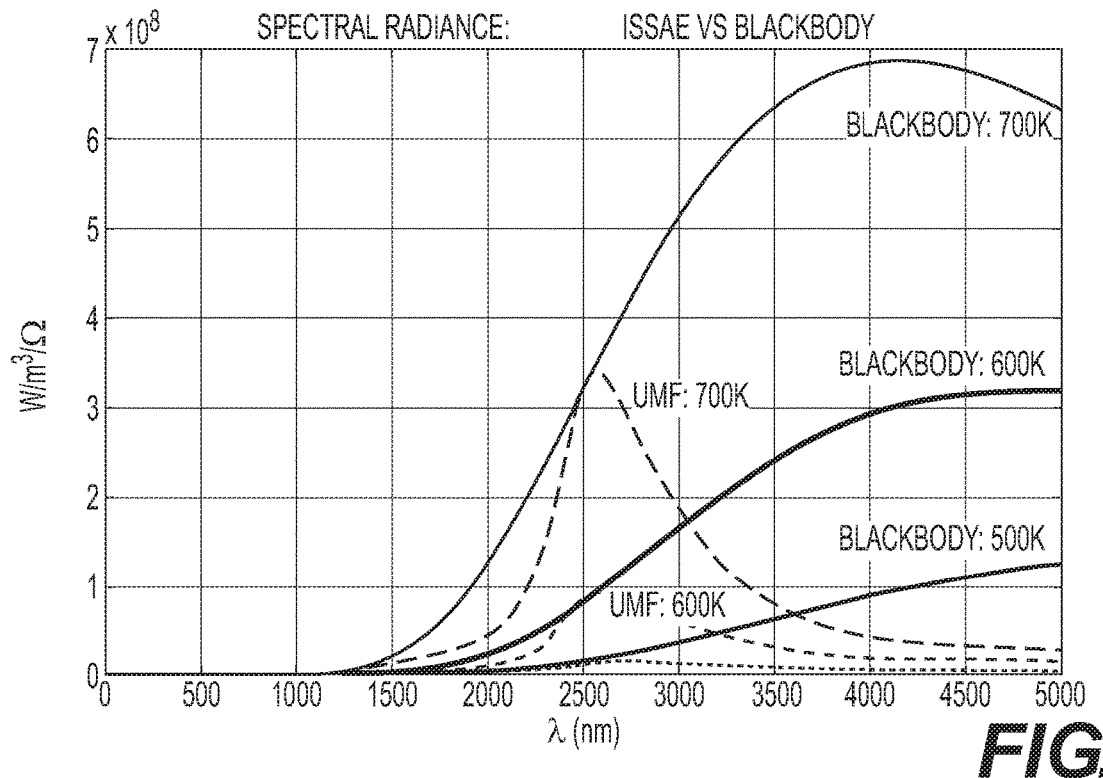
FIG. 2 illustrates the spectral radiance of a preferred embodiment of an ISSAE.
Figure 3:
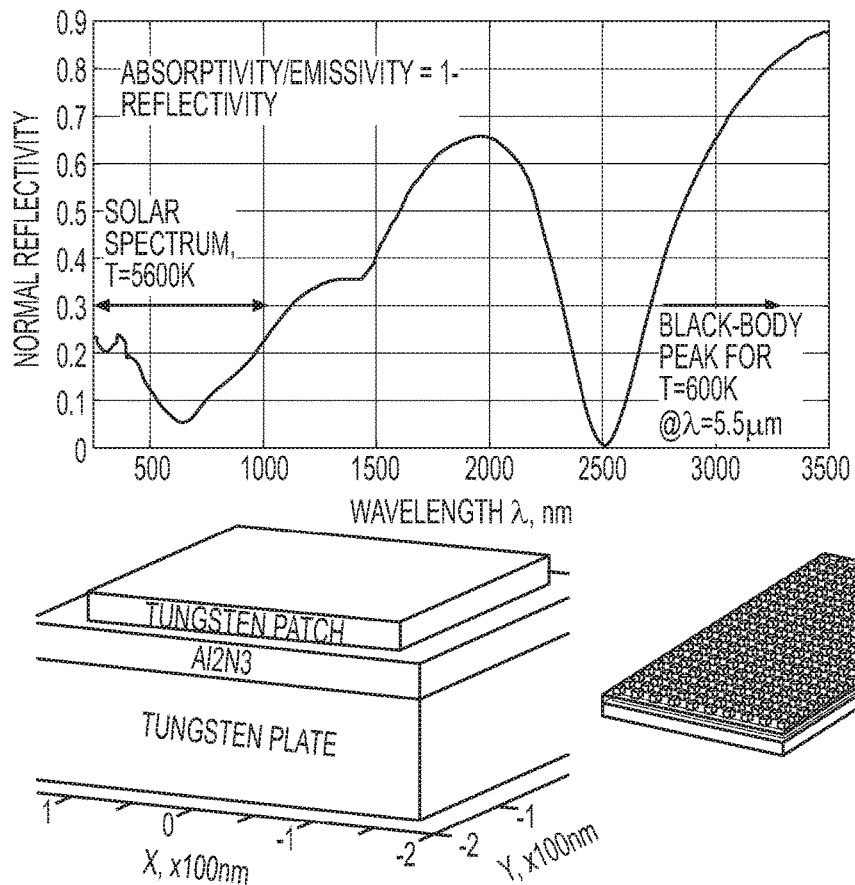
FIG. 3 illustrates the dimensions and materials of a preferred embodiment of an ISSAE.

A preferred embodiment of the ISSAE is shown in FIG. 3, illustrating both a unit cell and a film comprised of a plurality of said cells. Square metal patches are employed within this particular embodiment, whereas other preferred embodiments employ different shapes. One of the features of the herein-described ISSAE is that it is extremely thin (typically under 100 nm) and, therefore, flexible. Thus, the ISSAE can be conformally wrapped around heat exchange structures, for example hollow tubes that contain heat exchange fluid, such as synthetic oil, molten salt, or pressurized vapor, circulating through them.

Figure 4:
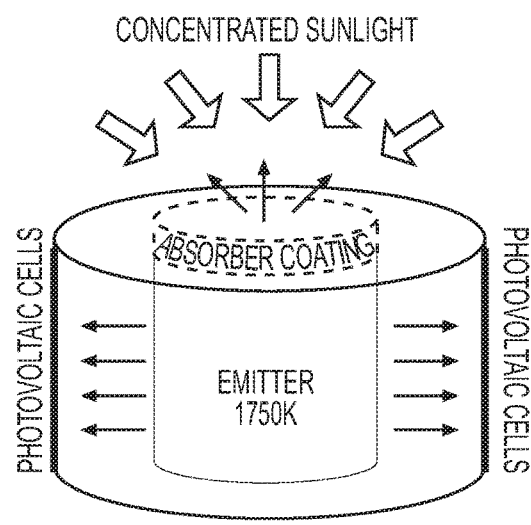
FIG. 4 illustrates conceptually a preferred embodiment of a TPV system comprising a preferred embodiment of an ISSAE.

In a preferred embodiment illustrated in FIG. 4, the TPV cells are placed outside of a cylindrically-shaped absorber/emitter comprised of said ISSAE. This geometry is attractive because heat-exchange fluid can be circulated inside the absorber/emitter and used to store heat for night-time operation. Moreover, combining the functions of the absorber and emitter within a single ISSAE, we can employ fully cloaked heat exchange pipes that better retain heat for use during nighttime operation. Any geometrical break/interruption of the absorber/emitter would otherwise result in additional infrared radiation losses. Note that this embodiment uses the inner surface of said ISSAE as the absorber and the outer surface of said ISSAE as the emitter, said ISSAE being wrapped around a fluid-carrying pipe and surrounded by one or more PV cells.

Distinctive Features of the Invention

Distinctive features of the herein-described ISSAE include (a) the use of resonant metal-based resonators for spectrally-selective emission of infrared photons; (b) the use of non-shiny metals (W, Mo, Pt) which are strongly absorbing in the solar spectral range 250 nm$<\lambda<1$ μm, yet are mostly reflective in the infrared spectral range $\lambda>3.5$ μm; (c) the ultra-thin nature (in some embodiments less than 100 nm) enabling the wrapping of hot surfaces, such as pipes filled with heat-exchange fluid.

The herein-described ISSAE solves several problems in the areas of solar thermal energy and thermophotovoltaics, in particular pertaining to use as part of an apparatus containing thermophotovoltaic cells that can more readily operate around the clock, including nighttime and cloudy days when sunlight is diminished or unavailable. As previously delineated, the herein-described ISSAE provides: (i) efficient sunlight absorption, (ii) efficient thermal insulation from radiative loss through emission of the infrared radiation, and (iii) spectrally-selective emission of infrared radiation, said spectrum matching the bandgap of the narrow-gap semiconductors used in the thermophotovoltaic cells. Characteristic (i) improves the efficiency of sunlight collection. Characteristic (ii) improves energy storage by providing heat insulation to hot heat-exchange agents (fluids, molten salts, for example). Characteristic (iii) improves the efficiency of electricity generation by photovoltaic cells, reduces their heating by high-energy photons, and enables the use of thinner photovoltaic cells.

Present alternatives known in the art can sometimes provide a subset of the above-delineated characteristics, but not all three at once.

Preferred Embodiments of the Invention

Figure 5:
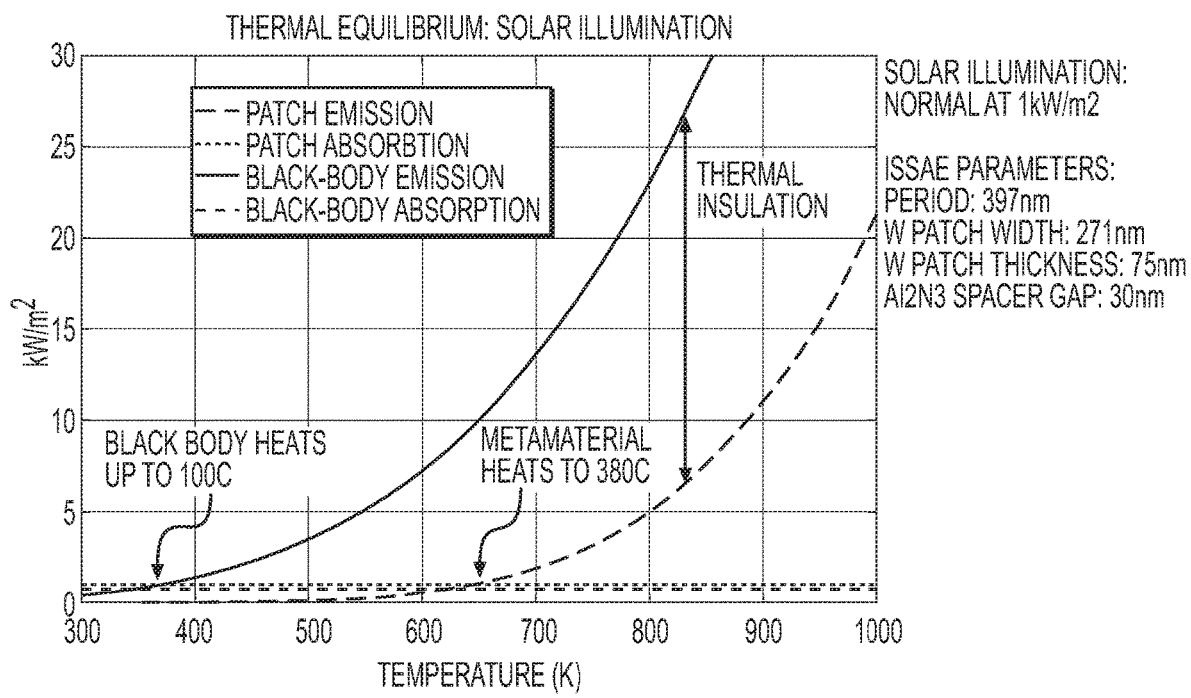
FIG. 5 illustrates the thermal equilibrium of a preferred embodiment of an ISSAE. This specific ISSAE provides thermal insulation and enables heating to higher temperature. Thermal insulation simplifies solar concentration, sometimes making it unnecessary.

In a preferred embodiment, an ISSAE is fabricated whereby a tungsten ground plane layer is separated from a tungsten patch layer by an aluminum nitride dielectric layer, said ground plane layer being between 100 and 400 nm thick, said dielectric layer being 30 nm thick, and said patch layer being 75 nm thick. Said ground plane and dielectric layers are comprised of solid contiguous material of arbitrary width and length, whereas said patch layer is comprised of a series of 271 nm×271 nm squares, spaced upon 397 nm centers in each direction. FIG. 3 illustrates this geometry, and further illustrates the reflectivity of said ISSAE across a wide spectrum. FIG. 5 illustrates the thermal emission and absorption of said ISSAE at temperatures between 300 and 1000 K.

Figure 6:
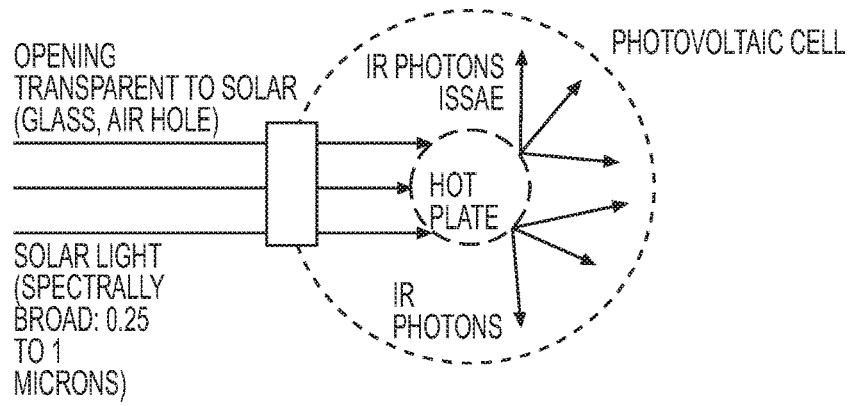
FIG. 6 illustrates conceptually a preferred embodiment of a TPV system comprising a preferred embodiment of an ISSAE. The ISSAE absorbs solar light, causes the hotplate to be heated to high temperature, and then re-emits light in the form of infrared photons. The IR photons are absorbed by the photovoltaic cell and converted into electricity.

In a preferred embodiment of a solar energy conversion apparatus utilizing a preferred embodiment of the herein-described ISSAE, as illustrated in FIG. 6, said ISSAE is deposited on top of a cylindrical object that serves as a hot plate, in such a way that said ISSAE absorbs solar light and heats said hot plate to a high temperature. Because said ISSAE is deposited onto said hot plate, said ISSAE also reaches a high temperature, which causes said ISSAE to re-emit light in the form of infrared photons. Said infrared photons are then absorbed by one or more photovoltaic cells situated around the hot plate, and converted into electricity. Each photovoltaic cell is chosen in such a way as to match its band-gap to the wavelength of infrared photons emitted by the ISSAE, thereby enabling the efficient transfer of energy between the ISSAE and the photovoltaic cell.

Figure 7:
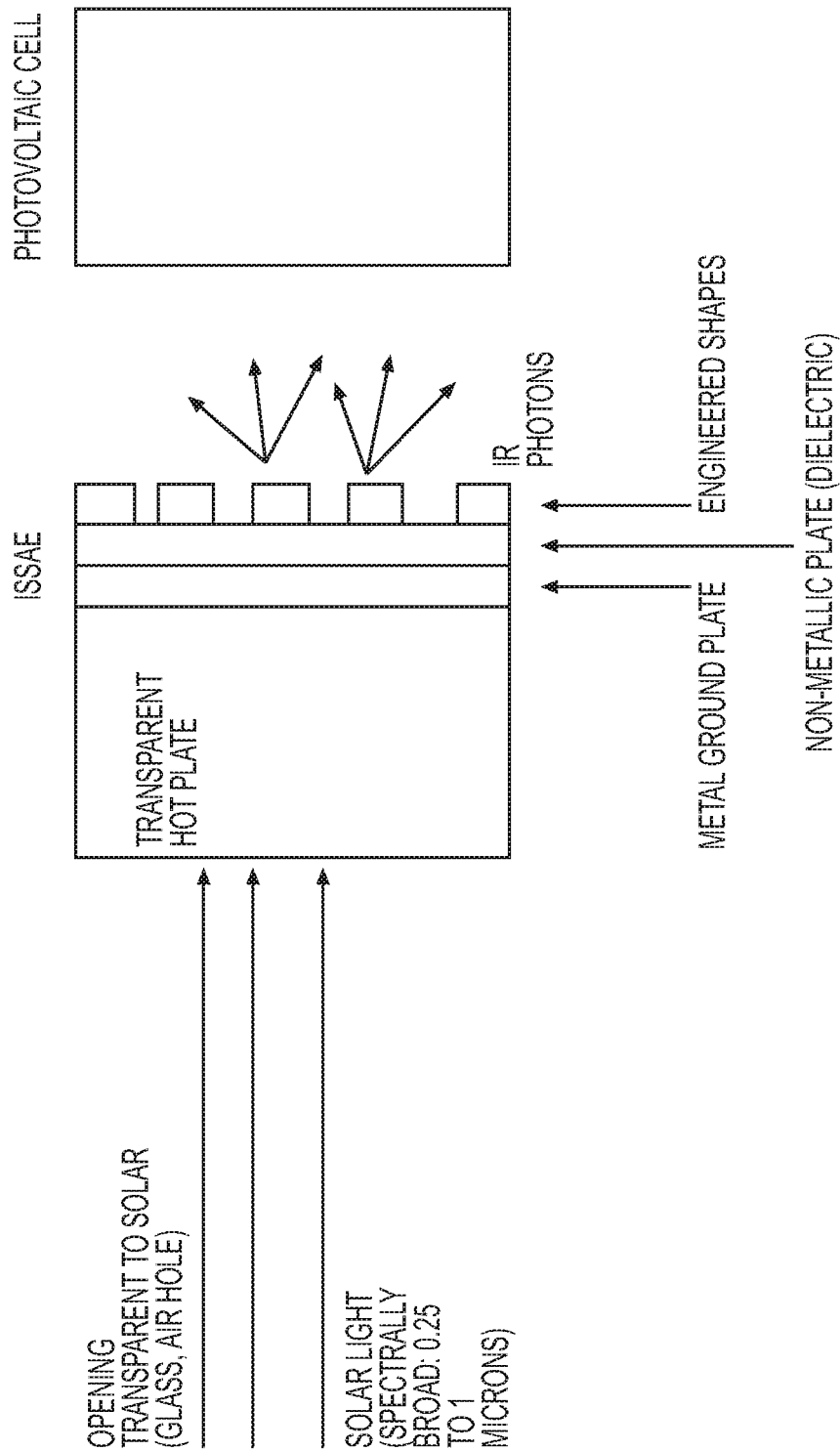
FIG. 7 illustrates conceptually a preferred embodiment of a TPV system comprising a preferred embodiment of an ISSAE. This embodiment takes advantage of the asymmetric nature of the IR emissivity of the ground plate based spectrally selective emitter: it can absorb light incident from the ground plate's side, yet emits IR photons only away from the Sun towards the PV cell.

In another preferred embodiment of a solar energy conversion apparatus utilizing a preferred embodiment of the herein-described ISSAE, as illustrated in FIG. 7, said ISSAE is deposited on a transparent planar hot plate, said hot plate absorbing light incident from the ground plate's side, and emitting IR photons away from the solar source, towards the photovoltaic cell. Each photovoltaic cell is comprised of a p-n junction of a semiconductor with a band gap tuned to the wavelength of the emitted IR photons. In other preferred embodiments, said photovoltaic cells are based on other physical photon absorption mechanisms, such as field emission across the Schottky barrier in a metal-semiconductor junction.

Figure 8:
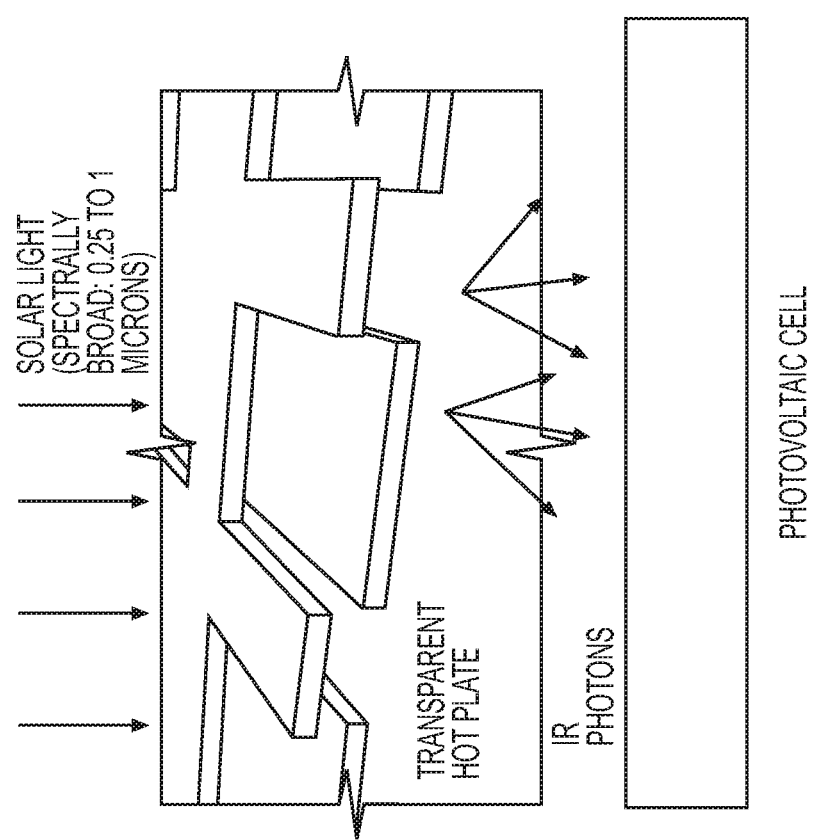
FIG. 8 illustrates a preferred embodiment of an ISSAE. The structure containing metal patches is separated from a "holey" ground plate.
Figure 9C:
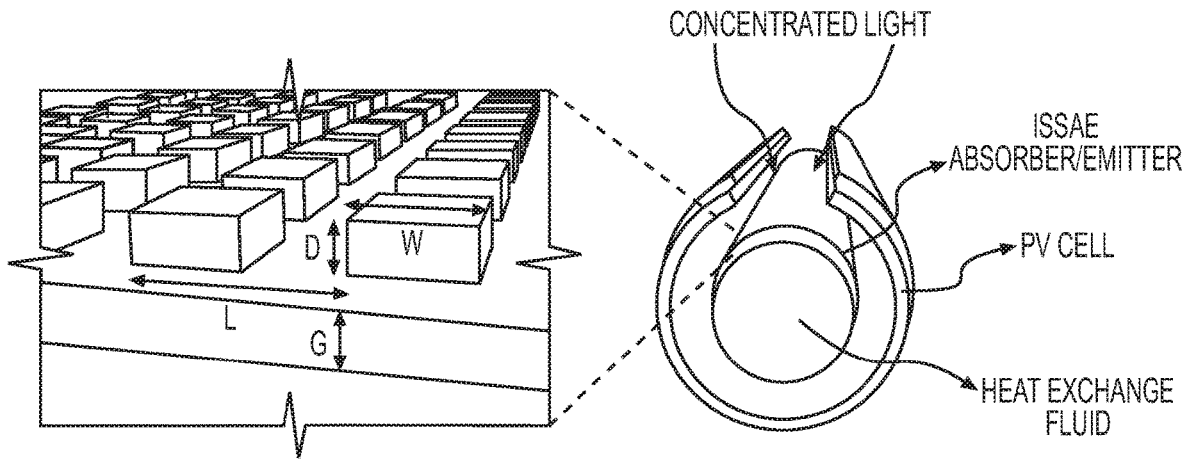
FIG. 9C illustrates the calculated absorbance spectra of a plurality of variations on the preferred embodiment of FIG. 9A.
Figure 9C:
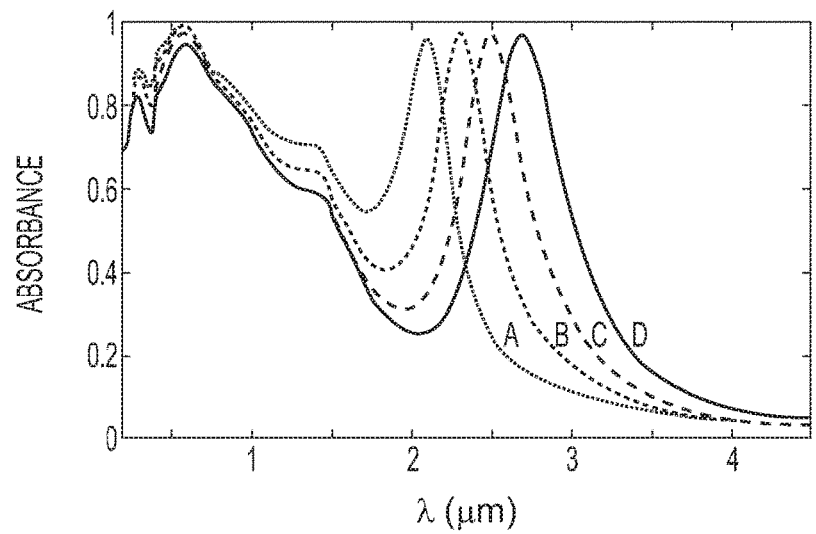

In another preferred embodiment of the herein-described ISSAE, as illustrated in FIG. 8, the ground plane layer of the ISSAE comprises a series of engineered holes regularly spaced in relationship to the patch layer.

We claim:

1. A solar thermophotovoltaic system, comprising:
   a heat exchange pipe configured to contain a heat exchange fluid;
   a thin-film integrated spectrally-selective plasmonic absorber emitter (ISSAE) in direct contact with an outer surface of the heat exchange pipe, the ISSAE, comprising:
   an ultra-thin non-shiny metal layer comprising a metal strongly absorbing in a solar spectral range and strongly reflective in an infrared spectral range, the metal layer having an inner surface in direct contact with an outer surface of the heat exchange pipe;
   a hollow photovoltaic cell support structure having an inner surface in a concentric configuration surrounding at least a portion of the ISSAE; and
   an airgap separating the support structure and an outer surface of the metal layer, wherein the support structure comprises:
   a plurality of photovoltaic cells arranged on a portion of the inner surface of the support structure and configured to receive emissions from the ISSAE, and
   a solar energy collector/concentrator configured to allow solar radiation to impinge a portion of the metal layer.

2. The solar thermophotovoltaic system of claim 1, wherein the heat exchange fluid is selected from a group consisting of synthetic oil, molten salt, and pressurized vapor.

3. The solar thermophotovoltaic system of claim 1, wherein the non-shiny metal layer is formed from a metal selected from a group consisting of tungsten, platinum, and molybdenum.

4. The solar thermophotovoltaic system of claim 1, wherein the ISSAE absorber/emitter is tuned to emit photons at wavelengths predominantly within a band gap of the photovoltaic cells.

5. The solar thermophotovoltaic system of claim 4, wherein the ISSAE predominately absorbs energy at wavelengths between 250 nm and 1 μm, resonates at wavelengths between 1.5 μm and 3.0 μm, and predominately reflects energy at wavelengths greater than 3.5 μm.

6. The solar thermophotovoltaic system of claim 1, wherein the metal layer has a thickness of 100 nm or less.

7. The solar thermophotovoltaic system of claim 1, wherein a portion of the heat exchange pipe and a portion of the support structure comprise concentric cylinders, and wherein the solar energy collector/concentrator comprises one or more openings in the support structure, the openings selected from a group consisting of:
   one or more openings in a wall of the support structure; and
   one or more openings in an end cap of the support structure.

8. The solar thermophotovoltaic system of claim 7, further comprising: one or more lenses situated in such a way as to focus solar energy on metal layer.

9. The solar thermophotovoltaic system of claim 7, further comprising one or more mirrors situated in such a way as to focus solar energy on the metal layer.

10. The solar thermophotovoltaic system of claim 1, wherein the metal layer is continuously wrapped around the heat exchange pipe with no geometric breaks.

* * * * *